United States Patent
Lee et al.

(10) Patent No.: US 10,699,947 B2
(45) Date of Patent: Jun. 30, 2020

(54) METHOD OF MANUFACTURING DISPLAY APPARATUS AND DISPLAY APPARATUS MANUFACTURED USING THE SAME

(71) Applicant: SAMSUNG DISPLAY CO., LTD., Yongin-si, Gyeonggi-do (KR)

(72) Inventors: Changhan Lee, Yongin-si (KR); Yongjun Park, Yongin-si (KR); Changwoo Shim, Yongin-si (KR); Sanghun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/250,964

(22) Filed: Jan. 17, 2019

(65) Prior Publication Data

US 2019/0157613 A1 May 23, 2019

Related U.S. Application Data

(62) Division of application No. 15/203,022, filed on Jul. 6, 2016, now Pat. No. 10,217,961.

(30) Foreign Application Priority Data

Dec. 22, 2015 (KR) .......................... 10-2015-0184079

(51) Int. Cl.
*H01L 21/00* (2006.01)
*H01L 21/768* (2006.01)
(Continued)

(52) U.S. Cl.
CPC ...... *H01L 21/7688* (2013.01); *H01L 21/0272* (2013.01); *H01L 21/32135* (2013.01);
(Continued)

(58) Field of Classification Search
CPC ............. H01L 51/5253; H01L 51/5237; H01L 51/5246; H01L 27/3246; H01L 27/3244;
(Continued)

(56) References Cited

U.S. PATENT DOCUMENTS 9,123,680 B2 * 9/2015 Kwon ................. H01L 27/3276
9,437,831 B2 9/2016 Yamazaki et al.
(Continued)

FOREIGN PATENT DOCUMENTS

KR 10-2005-0112315 A 11/2005
KR 10-2006-0104531 A 10/2006
(Continued)

OTHER PUBLICATIONS

EPO Extended Search Report dated May 29, 2017, for corresponding European Patent Application No. 16204523.1 (8 pages).

*Primary Examiner* — Shouxiang Hu
(74) *Attorney, Agent, or Firm* — Lewis Roca Rothgerber Christie LLP

(57) ABSTRACT

A method of manufacturing a display apparatus includes preparing a substrate including a display area and a pad area outside of the display area, forming a sacrificial layer in the pad area, forming an encapsulation layer over the display area and the pad area, forming cracks in at least a portion of the encapsulation layer by increasing a volume of the sacrificial layer or by gasifying or evaporating at least a portion of the sacrificial layer, and removing at least a portion of the encapsulation layer in the pad area. A display apparatus is manufactured according to the manufacturing method.

14 Claims, 10 Drawing Sheets

(51) Int. Cl.

| | | |
|---|---|---|
| *H01L 51/52* | (2006.01) | |
| *H01L 27/32* | (2006.01) | |
| *H01L 21/3213* | (2006.01) | |
| *H01L 21/027* | (2006.01) | |
| *H01L 51/56* | (2006.01) | |

(52) U.S. Cl.
CPC ...... *H01L 27/3244* (2013.01); *H01L 27/3246* (2013.01); *H01L 51/5237* (2013.01); *H01L 51/5246* (2013.01); *H01L 51/5253* (2013.01); *H01L 51/56* (2013.01); *H01L 27/3276* (2013.01)

(58) Field of Classification Search
CPC . H01L 51/56; H01L 27/3276; H01L 21/0272; H01L 21/32135; H01L 21/7688
See application file for complete search history.

(56) References Cited

U.S. PATENT DOCUMENTS

| | | |
|---|---|---|
| 2003/0064171 A1 | 4/2003 | Burrows et al. |
| 2005/0202646 A1 | 9/2005 | Burrows et al. |
| 2006/0216951 A1 | 9/2006 | Moro et al. |
| 2006/0220056 A1 | 10/2006 | Lee |
| 2007/0164376 A1 | 7/2007 | Burrows et al. |
| 2012/0208306 A1 | 8/2012 | Haas et al. |
| 2013/0049003 A1 | 2/2013 | Choi et al. |
| 2014/0117316 A1 | 5/2014 | Choi |
| 2014/0204300 A1* | 7/2014 | Park .................. G02F 1/133305 349/41 |
| 2015/0001497 A1 | 1/2015 | Jung et al. |
| 2016/0164030 A1 | 6/2016 | Yasuda |

FOREIGN PATENT DOCUMENTS

| | | |
|---|---|---|
| KR | 10-2007-0050774 A | 5/2007 |
| KR | 10-2013-0015033 A | 2/2013 |
| TW | 201236233 A1 | 9/2012 |
| WO | WO 2015/008642 A1 | 1/2015 |

\* cited by examiner

METHOD OF MANUFACTURING DISPLAY APPARATUS AND DISPLAY APPARATUS MANUFACTURED USING THE SAME

CROSS-REFERENCE TO RELATED APPLICATION

This application is a divisional of U.S. patent application Ser. No. 15/203,022, filed Jul. 6, 2016, which claims priority to and the benefit of Korean Patent Application No. 10-2015-0184079, filed Dec. 22, 2015, the entire content of both of which is incorporated herein by reference.

BACKGROUND

1. Field

One or more embodiments relate to a method of manufacturing a display apparatus and a display apparatus manufactured using the same. For example, one or more embodiments relate to a method of manufacturing a display apparatus according to a simplified manufacturing process and a display apparatus manufactured using the same.

2. Description of the Related Art

Generally, a display apparatus includes a plurality of display elements, which are disposed on a substrate, and a pad, which is electrically coupled to (e.g., electrically connected to) the display elements. When various suitable electrical signals are applied to the display elements, the various suitable electrical signals are applied to the display elements through the pad.

Meanwhile, in order to protect the display elements, the display apparatus includes an encapsulation layer to at least partially cover the display elements. When the encapsulation layer is formed, the pad, to which the electrical signals are applied, needs to be exposed by the encapsulation layer. Accordingly, when the encapsulation layer is formed, a mask is used to form the encapsulation layer only (or substantially only) in a set (e.g., predetermined) area of the substrate.

However, since, in a method of manufacturing a display apparatus, the mask is used repeatedly to form the encapsulation layer and thus results in being damaged, the mask needs to be replaced with a new one periodically when the display apparatus is manufactured. Accordingly, the method of manufacturing a display apparatus has problems that manufacturing costs increase, and a process of precisely aligning the mask and the substrate relative to each other during the manufacture of the display apparatus.

SUMMARY

One or more embodiments include a method of manufacturing a display apparatus and a display apparatus manufactured using the same.

Additional aspects of embodiments will be set forth in part in the description which follows and, in part, will be apparent from the description, or may be learned by practice of the presented embodiments.

According to one or more embodiments, a method of manufacturing a display apparatus includes preparing a substrate including a display area and a pad area outside of the display area, forming a sacrificial layer in the pad area, forming an encapsulation layer over the display area and the pad area, forming cracks in at least a portion of the encapsulation layer by increasing a volume of the sacrificial layer or by gasifying or evaporating at least a portion of the sacrificial layer, and removing at least a portion of the encapsulation layer in the pad area.

The forming of the sacrificial layer may include concurrently (e.g., simultaneously) forming the organic layer in the display area and the sacrificial layer.

The forming of the sacrificial layer may include concurrently (e.g., simultaneously) forming an intermediate layer interposed between a pixel electrode and an opposite electrode in the display area, and the sacrificial layer.

The method may further include forming a display element in the display area. The forming of the sacrificial layer may include concurrently (e.g., simultaneously) forming a capping layer including an organic compound and at least partially covering the display element in the display area, and the sacrificial layer.

The forming of the cracks may include irradiating a laser beam to (e.g., into) the portion of the encapsulation layer which is disposed above the sacrificial layer.

The forming of the cracks may include using the laser beam having an absorbance in an organic compound greater than an inorganic compound.

The forming of the encapsulation layer may include forming an inorganic layer.

The method may further include increasing an area of the encapsulation layer, in which the cracks are formed, by applying a force to the encapsulation layer which is disposed above the sacrificial layer.

The increasing of the area may include using a roller.

The forming of the encapsulation layer may include forming a first inorganic encapsulation layer over the display area and the pad area, forming an organic encapsulation layer over the first inorganic encapsulation layer, the organic encapsulation layer including a first portion corresponding to the display area and a second portion separate from the first portion and corresponding to the pad area, and forming a second inorganic encapsulation layer in the display area and the pad area to at least partially cover the first portion and the second portion of the organic encapsulation layer.

An adhesive force between the first inorganic encapsulation layer and the organic encapsulation layer may be greater than an adhesive force between the first inorganic encapsulation layer and the sacrificial layer.

The removing of the portion of the encapsulation layer may include removing at least a portion of the first inorganic encapsulation layer in the pad area, the entire second portion of the organic encapsulation layer, and at least a portion of the second inorganic encapsulation layer in the pad area.

The method may further include forming an additional organic layer over the at least a portion of the encapsulation layer which is disposed over the sacrificial layer, and the removing of the portion of the encapsulation layer may include removing the portion of the encapsulation layer, which is over the sacrificial layer, and the entire additional organic layer.

An adhesive force between the encapsulation layer and the additional organic layer may be greater than an adhesive force between the encapsulation layer and the sacrificial layer.

According to one or more embodiments, a display apparatus may include a substrate including a display area and a pad area outside of the display area, display elements disposed in the display area, and an encapsulation layer at least partially covering the display area to at least partially cover the display elements, wherein a roughness of a first end surface of the encapsulation layer in a pad area direction is greater than a roughness of a second end surface of the encapsulation layer in a direction opposite to the pad area direction.

The encapsulation layer may include a first inorganic encapsulation layer at least partially covering the display area and the pad area, an organic encapsulation layer disposed over the first inorganic encapsulation layer and having an area less than an area of the first inorganic encapsulation layer, and a second inorganic encapsulation layer disposed over the organic encapsulation layer and contacting the first inorganic encapsulation layer outside of the organic encapsulation layer. The encapsulation layer may include a first end surface having a lower end surface most adjacent to the substrate, an upper end surface farthest from the substrate, and an intermediate end surface between the lower end surface and the upper end surface. A roughness of the lower end surface and a roughness of the upper end surface may be greater than a roughness of the intermediate end surface.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
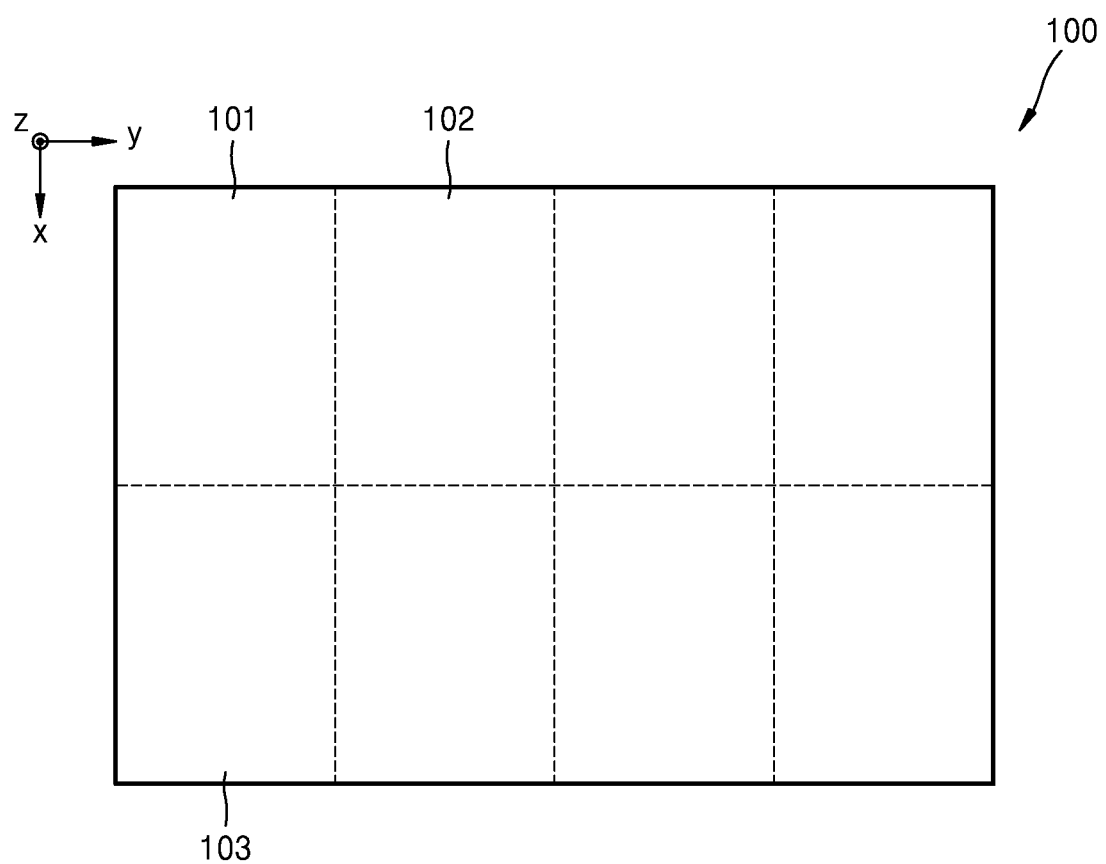
FIGS. 1-9 are respective cross-sectional views and plan views, schematically illustrating processes of a method of manufacturing a display apparatus according to embodiments of the presently disclosed subject matter.

The present embodiments may have different forms and should not be construed as being limited to the descriptions set forth herein. Accordingly, embodiments are merely described below, by referring to the figures, to explain aspects of the present description.

Reference will now be made in more detail to embodiments, examples of which are illustrated in the accompanying drawings, wherein like reference numerals refer to like elements throughout. Duplicate descriptions thereof will not be provided.

Sizes of elements in the drawings may be exaggerated for convenience of explanation. In other words, since sizes and thicknesses of components in the drawings may be arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular (e.g., substantially perpendicular) to one another, or may represent different directions that are not perpendicular to one another.

As used herein, the term "and/or" includes any and all combinations of one or more of the associated listed items. Expressions such as "at least one of," when preceding a list of elements, modify the entire list of elements and do not modify the individual elements of the list.

FIGS. 1 through 9 are respective cross-sectional views and plan views, schematically illustrating processes of a method of manufacturing a display apparatus according to embodiments of the presently disclosed subject matter.

Figure 2:
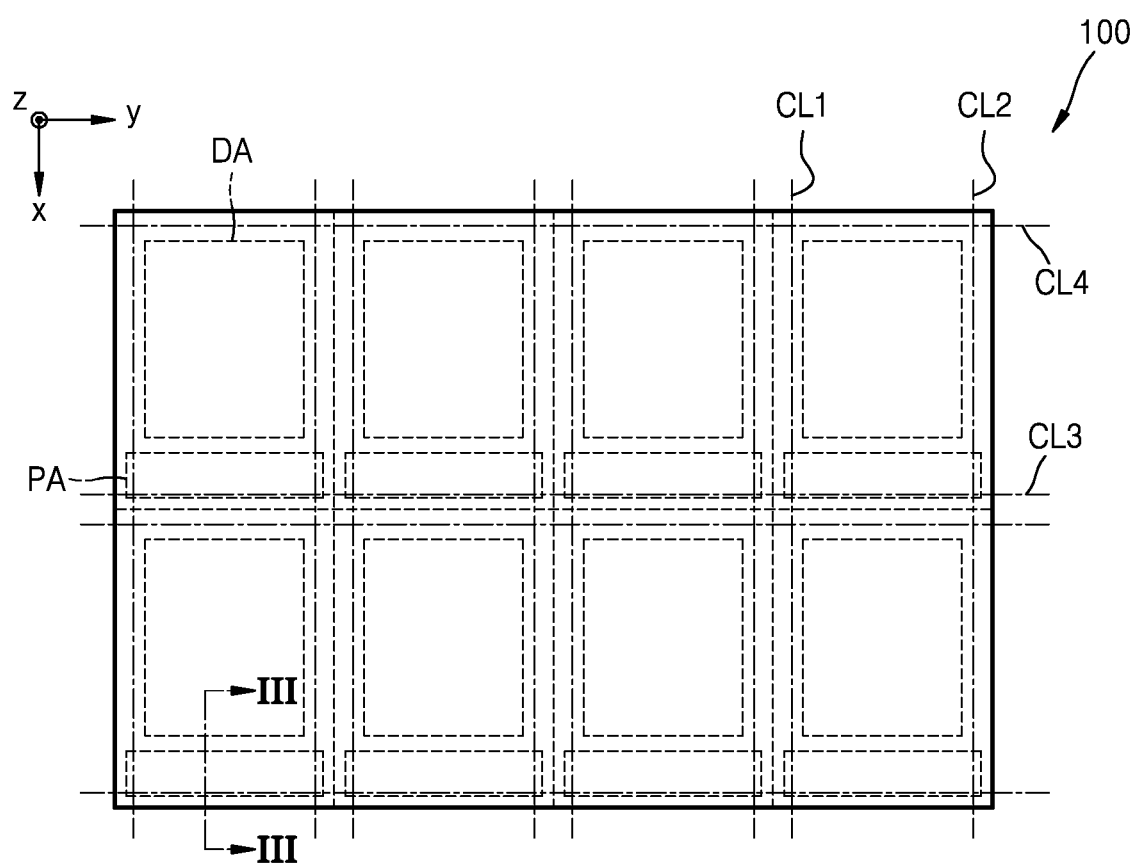

In the method according to embodiments of the present disclosure, a substrate 100 is prepared. The substrate 100 of FIG. 1 may be a mother substrate which is used to manufacture a plurality of display apparatuses. As described later herein, the substrate 100 of FIG. 1 is cut and separated into a plurality of substrates 101, 102, and 103 of the respective display apparatuses. The substrate 100 includes a display area DA and a pad area PD which is disposed outside of the display area DA, as illustrated in FIG. 2. In more detail, the substrate 100 includes a plurality of areas which are subsequently separated from each other and each of which includes the display area DA and the pad area PD disposed outside of the display area DA. The substrate 100 may include a plastic material such as, for example, polyimide or another material.

Figure 3:
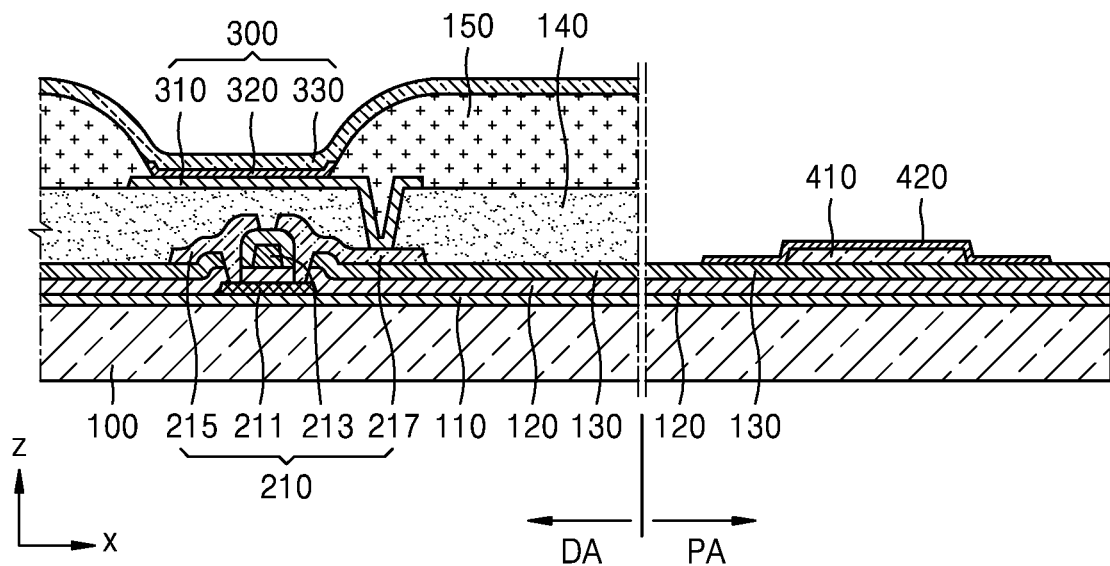

After the substrate 100 is prepared, one or more display elements 300 are disposed in the display area DA, and a pad 410 is disposed in the pad area PA, as illustrated in FIG. 3. FIG. 3 is a cross-sectional view illustrating a portion of the display area DA and a portion of the pad area PA and may be a cross-sectional view taken along a line III-III of FIG. 2. In this case, it is understood that elements, which are formed on the display area DA and the pad area PA, may be omitted from FIG. 2 for clarity.

In addition to the display elements 300 in the display area DA of the substrate 100, a thin film transistor 210, which is electrically coupled to (e.g., electrically connected to) the display element 300, may also be disposed in the display area DA, as illustrated in FIG. 3. In FIG. 3, the display element 300 may include an organic light-emitting element (hereinafter, referred to as the organic light-emitting element 300). The organic light-emitting element 300 is electrically coupled to (e.g., electrically connected to) the thin film transistor 210 when a pixel electrode 310 is electrically coupled to (e.g., electrically connected to) the thin film transistor 210. If necessary or desired, a thin film transistor may be disposed in a peripheral area, e.g., the pad area PA, of the substrate 100. The thin film transistor disposed in the pad area PA of the substrate 100 may be a portion of a circuit to control electrical signals which are applied to the display area DA.

The thin film transistor 210 may include a semiconductor layer 211 which includes, for example, amorphous silicon, polysilicon, or an organic semiconductor material, a gate electrode 213, a source electrode 215, and a drain electrode 217. In order to insulate the semiconductor layer 211 from the gate electrode 213, a gate insulating layer 120 may be between the semiconductor layer 211 and the gate electrode 213 and may include silicon oxide and/or silicon nitride. An interlayer insulating layer 130 may be disposed over the gate electrode 213 and may include silicon oxide and/or silicon nitride. The source electrode 215 and the drain electrode 217 may be disposed over the interlayer insulating layer 130.

In some embodiments, in order to protect the thin film transistor 210, a protection layer may at least partially cover (e.g., completely cover) the thin film transistor 210. The protection layer may include an inorganic compound such as silicon oxide, silicon nitride, and/or silicon oxynitride. The protection layer may be a single layer or a multilayer. A planarization layer 140 may be disposed over the protection layer. For example, when the organic light-emitting element 300 is disposed over the thin film transistor 210, as illustrated in FIG. 3, the planarization layer 140 may planarize an upper surface of the protection layer, which at least partially covers (e.g., completely covers) the thin film transistor 210. The planarization layer 140 may include an acryl-based organic compound or benzocyclobutene (BCB). Although FIG. 3 illustrates that the planarization layer 140 is a single layer, the planarization layer 140 may be a multilayer. The display apparatus according to embodiments of the present disclosure may include both the protection layer and the planarization layer 140 or may include one selected from the protection layer and the planarization layer 140.

In the display area DA of the substrate 100, the organic light-emitting element 300 may be disposed over the planarization layer 140, and may include the pixel electrode 310, an opposite electrode 330, and an intermediate layer 320 between the pixel electrode 310 and the opposite electrode 330. The pixel electrode 310 may be electrically coupled to (e.g., electrically connected to) the thin film transistor 210 by contacting one selected from the source electrode 215 and the drain electrode 217 of the thin film transistor 210 through an opening which is formed in the planarization layer 140, as illustrated in FIG. 3.

A pixel defining film 150 may be disposed over the planarization layer 140. The pixel defining film 150 defines a pixel by forming an opening therein, which exposes at least a center portion of the pixel electrode 310 to the outside (e.g., allows light to be transmitted from at least a center portion of the pixel electrode 310 to the outside). As illustrated in FIG. 3, the pixel defining film 150 increases a distance between a boundary of the pixel electrode 310 and the opposite electrode 330, which is disposed above the pixel electrode 310, to prevent the occurrence of an arc from the boundary of the pixel electrode 310 (or to reduce a likelihood or amount of such arcing). The pixel defining film 150 may include an organic compound such as, for example, polyimide.

The intermediate layer 320 of the organic light-emitting element 300 may include a small molecule material and/or a polymer material. When the intermediate layer 320 includes a low molecular weight material, the intermediate layer 320 may include a single layer or a multilayer stacked in a composite structure including a hole injection layer (HIL), a hole transport layer (HTL), an emissive layer, an electron transport layer (ETL), and/or an electron injection layer (EIL), and may include at least one selected from organic compounds and/or organometallic compounds, such as, for example, copper phthalocyanine (CuPc), N,N'-Di (naphthalene-1-yl)-N,N'-diphenyl-benzidine (NPB), and tris (8-hydrooxyquinoline)aluminum (Alq3). The above layers may be formed according to a vacuum deposition process.

When the intermediate layer 320 includes a polymer material, the intermediate layer 320 may include the HTL and an emissive layer. Here, the HTL may include, for example, poly(3,4-ethylenedioxythiophene) (PEDOT), and the emissive layer may include a polymer material such as, for example, a poly(p-phenylenevinylene) (PPV)-based material and a polyfluorene-based polymer material. The intermediate layer 320 may be formed according to a screen print method, an inkjet printing method, or a laser induced thermal imaging (LITI) method.

The intermediate layer 320 is not limited to the above-described structure, but may have at least one of various suitable structures. The intermediate layer 320 may be an integrated layer through the plurality of pixel electrodes 310 or a patterned layer to correspond to each of the plurality of pixel electrodes 310.

The opposite electrode 330 is disposed over the display area DA, and the opposite electrode 330 may at least partially cover (e.g., completely cover) the display area DA, as illustrated in FIG. 3. For example, the opposite electrode 330 includes a plurality of organic light-emitting elements 300 which are integrated to correspond to the plurality of pixel electrodes 310.

A plurality of pads 410 may be disposed on pad areas PA of the substrate 100. As illustrated in FIG. 3, the plurality of pads 410 may be disposed over the interlayer insulating layer 130, e.g., over the same layer as the source electrode 215 and the drain electrode 217. In this case, the plurality of pads 410 may include the same material (e.g., substantially the same material) as the source electrode 215 and the drain electrode 217, and may be concurrently (e.g., simultaneously) formed together with the source electrode 215 and the drain electrode 217 according to a manufacturing process. However, the present disclosure is not limited thereto. Various suitable processes may be used to form the pads 410. For example, the pads 410 and the gate electrode 213 may be concurrently (e.g., simultaneously) formed and may include the same material (e.g., substantially the same material).

As such, after the display elements 300 and the pads 410 are formed in the display area DA and the pad area PA of the substrate 100, respectively, a sacrificial layer 420 is formed over the pad area PA, as illustrated in FIG. 3. The sacrificial layer 420 may at least partially cover (e.g., completely cover) the entire (e.g., substantially the entire) pad area PA or may at least partially cover (e.g., completely cover) a portion of the pad area PA. For example, FIG. 3 illustrates that the sacrificial layer 420 at least partially covers (e.g., completely covers) the pad 410 of the pad area PA.

Although the sacrificial layer 420 may be formed independently from other elements of the display apparatus, the sacrificial layer 420 may be concurrently (e.g., simultaneously) formed together with at least one of the other elements of the display apparatus. For example, when the intermediate layer 320 is formed in the display area DA, the sacrificial layer 420 may be formed with the same material (e.g., substantially the same material) as the intermediate layer 320. In more detail, when the HIL or the ETL is formed in the display area DA, the sacrificial layer 420 may be concurrently (e.g., simultaneously) formed in the pad area PA with the same material (e.g., substantially the same material) as the HIL or the ETL when the HIL or the ETL is formed in the display area DA. A buffer layer 110 may be disposed between the between the substrate 100 and the gate insulating layer 120 and/or between the substrate 100 and the semiconductor layer 211.

Figure 4:
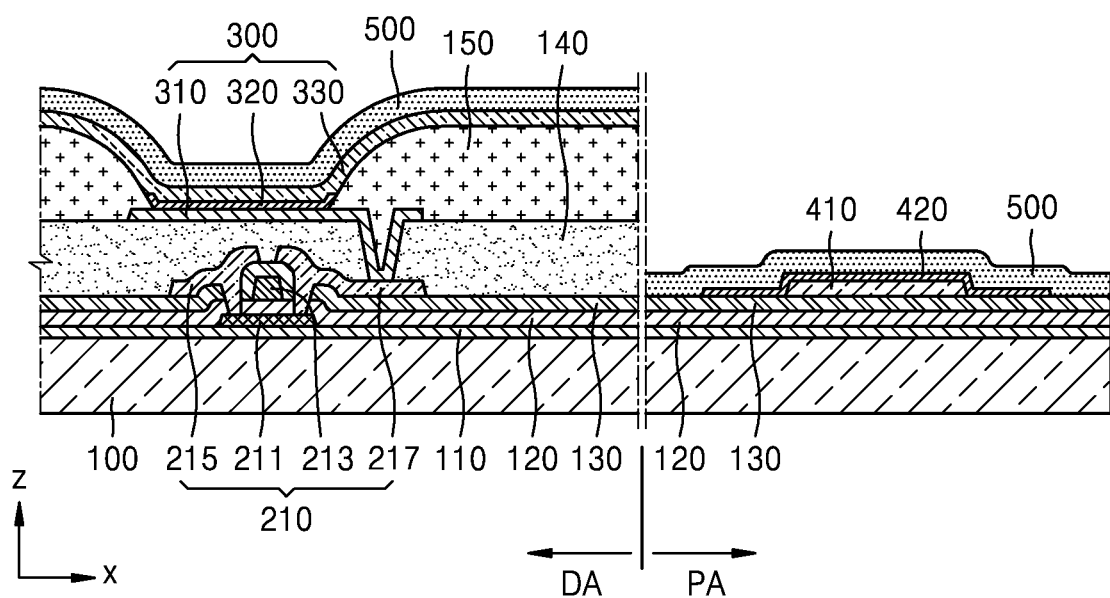

Thereafter, as illustrated in FIG. 4, an encapsulation layer 500 is formed through the display area DA and the pad area PA. The encapsulation layer 500 may be a single layer or a multilayer. When the encapsulation layer 500 is a single layer, the encapsulation layer 500 may include an inorganic layer. When the encapsulation layer 500 is a multilayer, the encapsulation layer 500 may include an inorganic layer and an organic layer. The inorganic layer may be formed according to a deposition process, and the inorganic layer may include, for example, silicon nitride, silicon oxide and/or silicon oxynitride or may include metal oxide, metal nitride, metal oxynitride, and/or metal carbide. The organic layer may include, for example, polyacrylate, polyethylene terephthalate (PET), polyethylene naphthalate (PEN), polycarbonate, polyimide, polyethylene sulfonate, polyoxymethylene, polyarylate, and/or epoxy.

After the encapsulation layer 500 is formed, the substrate 100 is cut to form a plurality of display apparatuses. The substrate 100 may be cut along cutting lines CL1, CL2, CL3, and CL4, as illustrated in FIG. 2. For example, the substrate 100 may be cut by irradiating a laser beam along the cutting lines CL1, CL2, CL3, and CL4. Here, because the cutting lines CL1 and CL2 and the cutting line CL3 may pass through at least a portion of the pad area PA, as illustrated in FIG. 2, the laser beam may be controlled to pass through at least a portion of the sacrificial layer 420 when the laser beam is irradiated on or to the sacrificial layer. The cutting line CL3 passes through the sacrificial layer 420, as illustrated in FIG. 5.

By irradiating the laser beam into the sacrificial layer 420 when the laser beam is irradiated along the cutting lines CL1, CL2, and CL3, at least a dimension of the portion of the sacrificial layer 420 increases or the portion of the sacrificial layer 420 is gasified or evaporated. At this time, when at least a dimension of the portion of the sacrificial layer 420 increases or at least the portion of the sacrificial layer 420 is gasified or evaporated, cracks CR may be formed in the portion of the encapsulation layer 420 which is disposed over the sacrificial layer 420. For example, by irradiating the laser beam into the sacrificial layer 420, the portion of the sacrificial layer 420, into which the laser beam is irradiated, increases or is gasified or evaporated, and thus, cracks CR may be formed in the portion of the encapsulation layer 500 which corresponds to the portion of the sacrificial layer 420. For this reason, the encapsulation layer 500 may include an inorganic layer. The inorganic layer may easily generate the cracks CR when a layer below the inorganic layer is changed in volume or deformed in shape.

Figure 5:
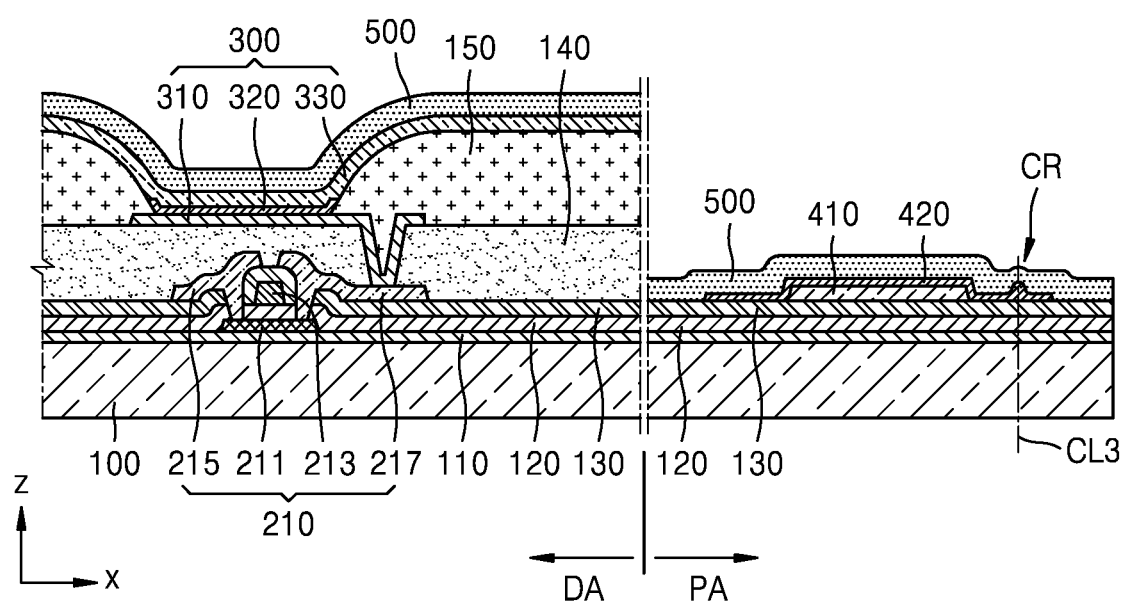
Figure 6:
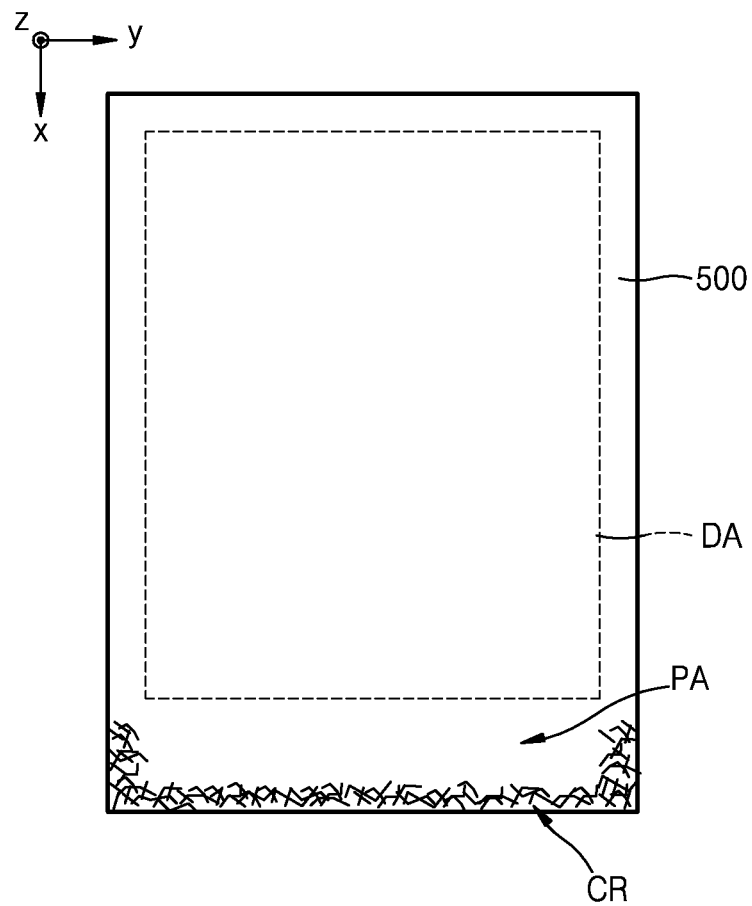

The cross-sectional view of FIG. 5 illustrates a state in which a volume of the portion of the sacrificial layer 420 is increased, and the plan view of FIG. 6 after cutting the substrate 100 illustrates the cracks CR in the pad area PA of the encapsulation layer 500 which at least partially covers (e.g., completely covers) the display area DA and the pad area PA. The cutting lines CL1, CL2, and CL3 pass through the pad areas Pas, as illustrated in FIG. 2, cracks CR are generated in areas of the encapsulation layer 420, which are disposed adjacent to the cutting lines CL1, CL2, and CL3, and below which the sacrificial layer 420 is disposed. Although FIG. 5 illustrates that the substrate 100 does not show the cut along the cutting line CL3 for convenience, the substrate 100 is cut along the cutting line CL3.

Although the laser beam is irradiated onto the portion of the encapsulation layer 500 which is disposed on the sacrificial layer 420, if the laser beam is an infrared laser beam, most of the infrared laser beam arrives at the sacrificial layer 420 after passing through the inorganic layer of the encapsulation layer 500, As a result, the portion of the sacrificial layer 420, into which the laser beam is irradiated, may be changed in volume or may be gasified or evaporated. If the laser beam is absorbed by the inorganic layer of the encapsulation layer 500, the encapsulation layer 500 itself may be cut without the cracks CR formed therein. In this case, even if the cracks CR are generated in the encapsulation layer 500, an area of the encapsulation layer 500, in which the cracks CR are generated, is very small, and the cracks CR which are formed in the pad area PA of the encapsulation layer 500 may not easily grow as described later herein. Accordingly, the laser beam, which is used to cut the substrate 100, may be a laser beam having a higher absorbance by an organic compound than an inorganic compound (e.g., the organic compound described herein may absorb more of the laser beam than the inorganic compound described herein).

Meanwhile, when the substrate 100 is cut by using the laser beam, even if the laser beam is absorbed by the inorganic layer of the encapsulation layer 500 and thus the encapsulation layer 500 is cut, the laser beam is also concurrently (e.g., simultaneously) absorbed by the sacrificial layer 420, and thus the portion of the sacrificial layer 420 may be changed in volume or may be gasified or evaporated so that the cracks CR are generated in the encapsulation layer 500.

The more that cracks CR are generated in the encapsulation layer 500, the more of an area of the encapsulation layer 500, in which the cracks CR are generated, is enlarged, as described later herein. Accordingly, when the sacrificial layer 420 is formed, a width of the sacrificial layer 420 in a lengthwise direction (Y direction) is greater than a width of the display area DA in the lengthwise direction (Y direction), and thus, it is desirable that the cutting line CL3, which extends in the lengthwise direction (Y direction) of the sacrificial layer 420, as well as the cutting lines CL1 and CL2, which extend in a direction (X direction) which intersects the lengthwise direction (Y direction), may pass therethrough, as illustrated in FIG. 2. Accordingly, cracks CR may be generated along three boundaries of the pad area PA with respect to a plan view, as illustrated in FIG. 6.

Figure 7:
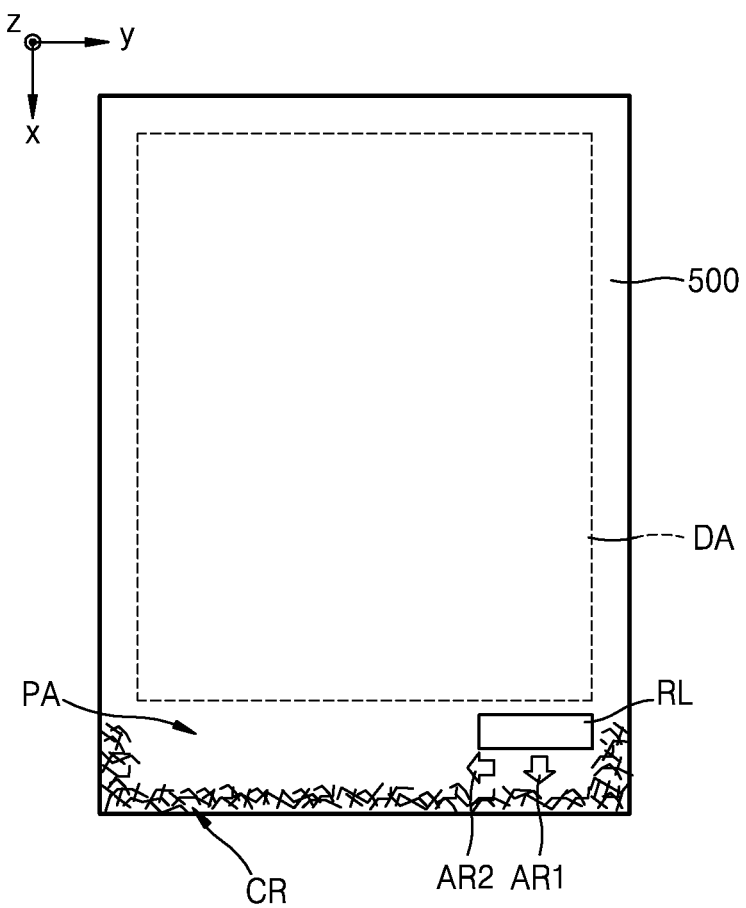

As such, after the cracks CR are generated in the portion of the encapsulation layer 500 which is disposed above the sacrificial layer 420, at least the portion of encapsulation layer 500 in the pad area PA may be removed. Before this, as illustrated in FIG. 7, the area of the encapsulation layer 500, in which the cracks CR are generated, may be increased by applying a force to the portion of the encapsulation layer 500 which is disposed above the sacrificial layer 420 (e.g., an amount of the cracks CR may be increased by applying a force to the portion of the encapsulation layer 500 which is disposed above the sacrificial layer 420). For example, a roller RL may move on the pad area PA from a portion of the display area DA to a boundary of the substrate 100 in an arrow direction AR1 (+X direction). Here, the roller RL may move while a force is applied in a direction (−Z direction) of the substrate 100 (e.g., the force may be applied toward the substrate 100), and thus, cracks CR may grow in the pad area PA to increase the area of the encapsulation layer 500 in which the cracks CR are formed.

Here, the roller RL may not only move from a boundary of the substrate 100, in which the cracks CR are formed, to the display area DA in a direction (−X direction) but also may move from the display area DA (e.g., from a boundary of the display area DA) to the boundary of the substrate 100 in the direction AR1 (+X direction). When the roller RL may not only move from the boundary of the substrate 100 in which the cracks CR are formed to the display area DA (e.g., to the boundary of the display area DA) in the direction AR1 (−X direction), it is possible that the performance of the encapsulation layer 500 may be degraded and defects may occur when the already-grown cracks CR are overgrown toward an inside of the display area DA.

Thereafter, when the roller RL moves from the boundary of the pad area PA of the substrate 100 in an arrow direction AR2 parallel to the boundary of the pad area PA of the substrate 100, the portion of the encapsulation layer 500, which is weakened by the generated cracks CR, may be separated from the substrate 100. For example, when the roller RL moves from the display area DA (e.g., from the boundary of the display area DA) to the boundary of the substrate 100 in the direction AR1 (+X direction), the roller RL may roll. However, when the roller RL moves from the boundary of the pad area PA of the substrate 100 in the arrow direction AR2, the roller RL may not roll, but a force applied to the roller RL may cause the portion of the encapsulation layer 500, in which the cracks CR are formed, to slide, and thus the portion of the encapsulation layer 500 may be separated from the substrate 100 and may protrude as a convex shape in an upper direction (+Z direction). Through this process, the portion of the encapsulation layer 500 may be removed in the pad area PA of the substrate 100, as illustrated in the cross-sectional view of FIG. 8 and the plan view of FIG. 9. Accordingly, the encapsulation layer 500 no longer covers (e.g., no longer completely covers) the pad 410, and thus a printed circuit board or an electrical chip may be electrically coupled to (e.g., electrically connected to) the pad 410.

A process of removing the portion of the encapsulation layer 500 in the pad area PA of the substrate 100 may not be limited to the above-described process using the roller RL. For example, at least one of various suitable processes may be used such as, for example, an adhesive tape may be used to remove the portion of the encapsulation layer 500 in which the cracks CR are formed.

In a method of manufacturing the display apparatus according to an embodiment of the present disclosure, when the encapsulation layer 500 is formed, it is not necessary to use any additional separate mask so that the encapsulation layer 500 is not formed on the pad area PA. Accordingly, since a mask is not used to form the encapsulation layer 500 in the manufacturing method, it is not necessary to align the mask and the substrate 100 relative to each other, manufacturing costs may decrease, and the manufacturing method is simplified.

Meanwhile, it may be necessary or desired to separate the portion of the encapsulation layer 500, in which the cracks CR are formed, from the substrate 100, for example, from lower elements which are disposed below the encapsulation layer 500. For this, the sacrificial layer 420 may have a low adhesiveness with or to the lower elements. As described above, in the case of the organic compound of the hole injection layer (HIL) or the electron transport layer (ETL), since the adhesiveness of the organic compound to the pad 410 including a metal and the interlayer insulating layer 130 including the inorganic compound is low, the sacrificial layer 420 may be concurrently (e.g., simultaneously) formed together with the above-described layer (e.g., HIL or EIL) by using the same material (e.g., substantially the same material) as the above-described layer (e.g., the HIL or ETL). Therefore, embodiments of the manufacturing method may be simplified, and the encapsulation layer in the pad area PA may be easily removed.

In the organic light-emitting display apparatus manufactured according to the above-described method, a roughness of a first end surface 501ES (FIGS. 8 and 9) of the encapsulation layer 500 facing the pads 410 is greater than a roughness of a second end surface 502ES (FIG. 9) of the encapsulation layer 500 facing away the pads 410 and roughnesses of third and fourth end surfaces 503ES and 504ES of the encapsulation layer 500 in other directions. The roughness of the first end surface 501ES (FIGS. 8 and 9) of the encapsulation layer 500 becomes greater since of the encapsulation layer 500 in the pad area PA is removed after the cracks CR are formed in the encapsulation layer 500 and then the formed cracks CR are grown. The roughnesses of the second, third, and fourth surfaces 502ES, 503ES, and 504ES become relatively lower since the encapsulation layer 500 is cut by irradiating the laser beam. For example, the roughness of the first end surface 501ES of the encapsulation layer 500 may be a root mean square (RMS) value of about 18.85 μm (e.g., the first end surface 501ES of the encapsulation layer 500 may have a root mean square (RMS) roughness value of about 18.85 μm).

In the roughnesses of the second, third, and fourth end surfaces 502ES, 503ES, and 504ES of the encapsulation layer 500, the second, third, and fourth end surfaces 502ES, 503ES, and 504ES of the encapsulation layer 500 are cut relatively cleanly since the substrate 100 is cut by heat, which is generated by the laser beam passing the encapsulation layer 500 during the cutting of the substrate 100.

Figure 10:
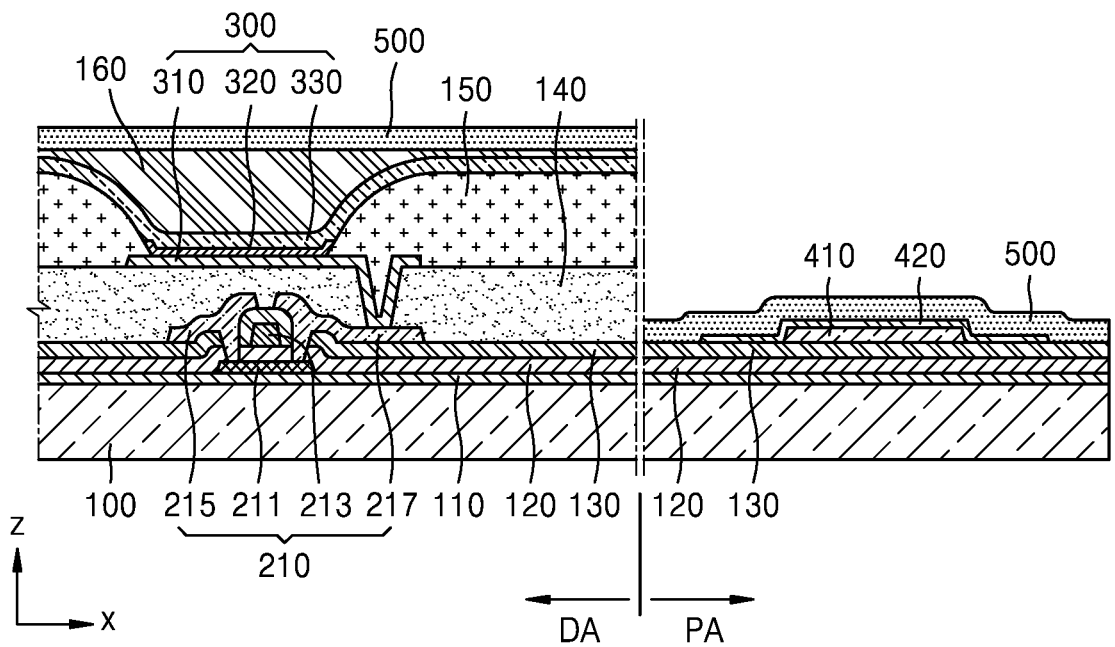
FIG. 10 is a cross-sectional view schematically illustrating a process of a method of manufacturing a display apparatus according to an embodiment.

FIG. 10 is a cross-sectional view schematically illustrating a process of a method of manufacturing a display apparatus, according to an embodiment. In the manufacturing method according to embodiments of the present disclosure, after the display element 300 is formed, a capping layer 160, which includes an organic compound, may be formed in the display area DA before the encapsulation layer 500 is formed. The capping layer 160 may include the organic compound which increases in volume or is gasified or evaporated when the laser beam is irradiated therein (e.g., thereto). The capping layer 160 may planarize the display area DA.

At this time, the sacrificial layer 420 may be concurrently (e.g., simultaneously) formed together with the capping layer 160 by using the same material (e.g., substantially the same material) as the capping layer 160. The encapsulation layer 500 may be formed in a single body in both the display area DA and the pad area PA. When the substrate 100 is cut by the laser beam irradiation, cracks CR may be formed in the portion of the encapsulation layer 500 above the sacrificial layer 420.

In the above-described method of manufacturing a display apparatus according to the previous embodiment and the above-described method of manufacturing the display apparatus according to the present embodiment, it is possible to perform a process of forming an organic layer, such as, for example, the intermediate layer 320 or the capping layer 160, in the display area DA of the substrate 100 and to concurrently (e.g., simultaneously) perform a process of forming the sacrificial layer 420 in the pad area PA of the substrate 100 when the process of forming an organic layer, such as the intermediate layer 320 or the capping layer 160, is performed in the display area DA of the substrate 100, thereby simplifying the manufacturing method. The sacrificial layer 420 may not be formed when the intermediate layer 320 or the capping layer 160 is formed, but may be formed during a process of forming any organic layer in the display area DA of the substrate 100, by using the same material (e.g., substantially the same material) of the organic layer.

Figure 11:
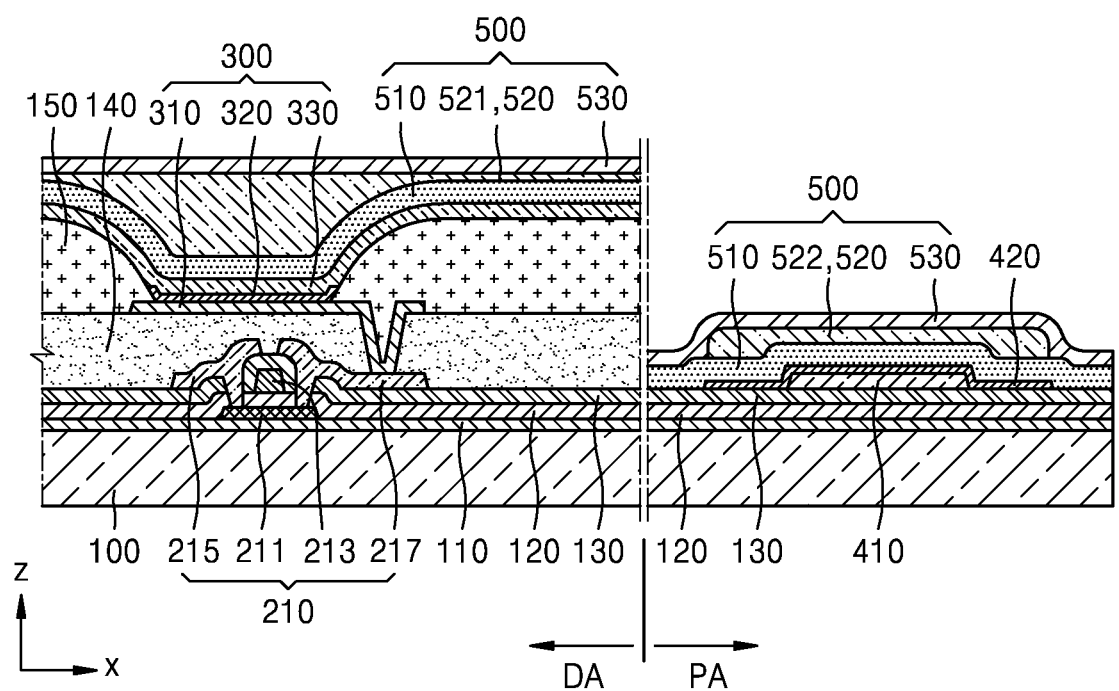
FIGS. 11 and 12 are cross-sectional views schematically illustrating a process of a method of manufacturing a display apparatus according to an embodiment.
Figure 12:
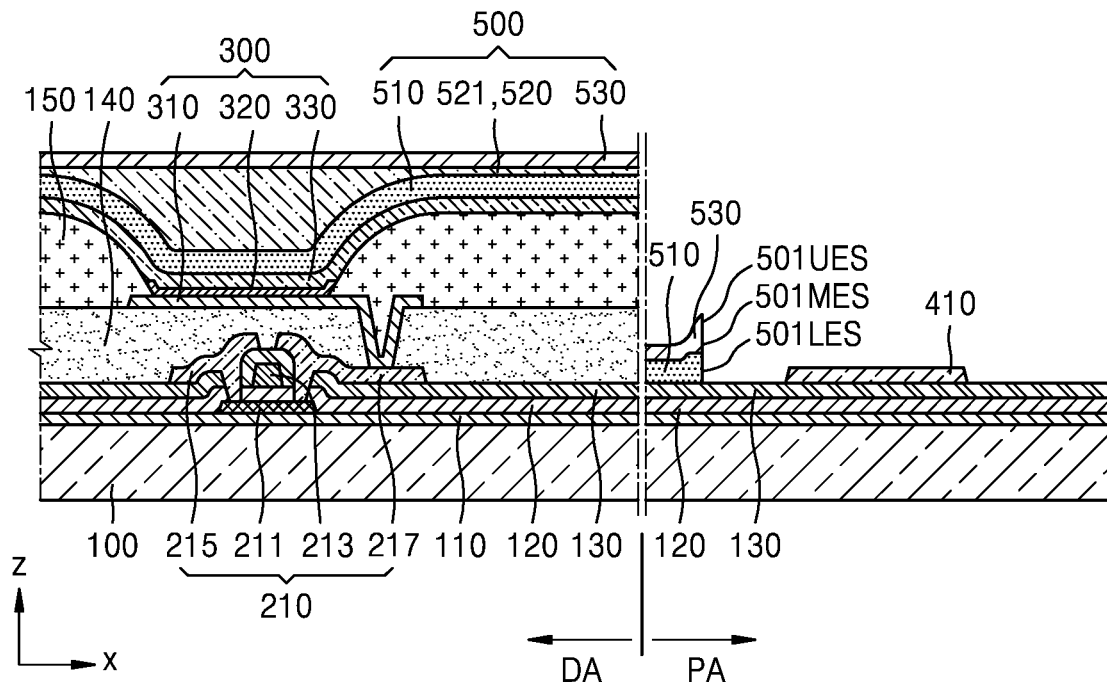

FIGS. 11 and 12 are cross-sectional views schematically illustrating a process of a method of manufacturing a display apparatus according to an embodiment. In the manufacturing method according to embodiments of the present disclosure, when the encapsulation layer 500 is formed, a first inorganic encapsulation layer 510 is formed as an integral layer on both the display area DA and the pad area PA, and then an organic encapsulation layer 520 is formed over the first inorganic encapsulation layer 510. The encapsulation layer 500 may include a first portion 521 and a second portion 522, which is spaced apart from the first portion 511 and corresponds to the pad area PA. Here, the statement "when the second portion 522 corresponds to the pad area PA" may be considered to mean "when the second portion 522 may correspond to at least a portion of the pad area PA."
The encapsulation layer 500 including the first portion 511 and the second portion 522 may be formed by using an inkjet printing method.

Thereafter, a second inorganic encapsulation layer 530 is formed in the display area DA and the pad area PA in a signal body to at least partially cover (e.g., completely cover) the first portion 521 and the second portion 522. The first inorganic encapsulation layer 510 and/or the second inorganic encapsulation layer 530 may be formed according to a deposition process and may include silicon nitride, silicon oxide and/or silicon oxynitride or may include metal oxide, metal nitride, metal oxynitride, and/or metal carbide. The organic encapsulation layer 520 may include polyacrylate, polyethylene terephthalate (PET), polyethylene naphthalate (PEN), polycarbonate, polyimide, polyethylene sulfonate, polyoxymethylene, polyarylate, and/or epoxy. The organic encapsulation layer 520 may include a monomer and then the monomer may be converted into polymer, according to embodiments of the manufacturing method.

In the above-described encapsulation layer 500, an adhesive force between the first inorganic encapsulation layer 510 and the organic encapsulation layer 520 may be greater than an adhesive force between the sacrificial layer 420 and the first inorganic encapsulation layer 510. In this case, when the laser beam is irradiated to cut the substrate 100, a volume of at least a portion of the sacrificial layer 420 may be increased or the portion of the sacrificial layer 420 may be gasified or evaporated. When the portion of the encapsulation layer 500 in the pad area PA is removed after the cracks CR formed in the first inorganic encapsulation layer 510 and/or the second inorganic encapsulation layer 530 grow, the first inorganic encapsulation layer 510, the organic encapsulation layer 520, and the second inorganic encapsulation layer 530 may be concurrently (e.g., simultaneously) separated from the sacrificial layer 420 and the lower elements while the first inorganic encapsulation layer 510, the organic encapsulation layer 520, and the second inorganic encapsulation layer 530 are prevented from being separated from each other (or a likelihood or amount of such separation is reduced), as illustrated in FIG. 12.

When the encapsulation layer 520 is formed, the second portion 522 of the encapsulation layer 500 may correspond to the sacrificial layer 420 described above. In this case, when at least a portion of the encapsulation layer 500 in the pad area PA is removed, at least a portion of the first inorganic encapsulation layer 510 in the pad area PA, the entire (e.g., substantially the entire) second portion 522 of the organic encapsulation layer 520, and at least a portion of the second inorganic encapsulation layer 530 in the pad area PA may be removed together. As a result, a part of the encapsulation layer 500 where the second inorganic encapsulation layer 530 contacts the first inorganic encapsulation layer 510 extends to a portion of the pad area PA outside the pads 410. Here, the portion of the pad area PA adjoins the display area DA. Further, the first end surface 501ES of the encapsulation layer 500 facing the pads 410 is substantially perpendicular to an upper surface of the substrate 100.

In this case, as illustrated in FIG. 12, the first end surface 501ES of the encapsulation layer 500 (See FIG. 8) includes a lower end surface 501LES which is disposed closest to the substrate 100, an upper end surface 501UES which is disposed farthest from the substrate 100, and an intermediate end surface 501MES between a lower cross-sectional surface of the lower end surface 501LES and the upper end surface 501UES. A cross-sectional surface of the intermediate surface 501MES may be referred to as a portion of the second inorganic encapsulation layer 530 which contacts the second portion 522 of the encapsulation layer 500. In this case, a roughness of the lower end surface 501LES and a roughness of the upper end surface 501UES may be greater than a roughness of the intermediate end surface 501MES. Since the intermediate end surface 501MES is a portion of the second inorganic encapsulation layer 530 which contacts the second portion 522 of the encapsulation layer 500, the intermediate end surface 501MES is smooth relatively to the lower end surface 501LES and the upper end surface 501UES. Since the cracks CR formed in the first inorganic encapsulation layer 510 and the second inorganic encapsulation layer 530 are grown, and then the first inorganic encapsulation layer 510 and the second inorganic encapsulation layer 530 are removed, the roughnesses of the lower end surface 501LES and the upper end surface 501UES may be relatively greater than the intermediate end surface 501MES.

Figure 13:
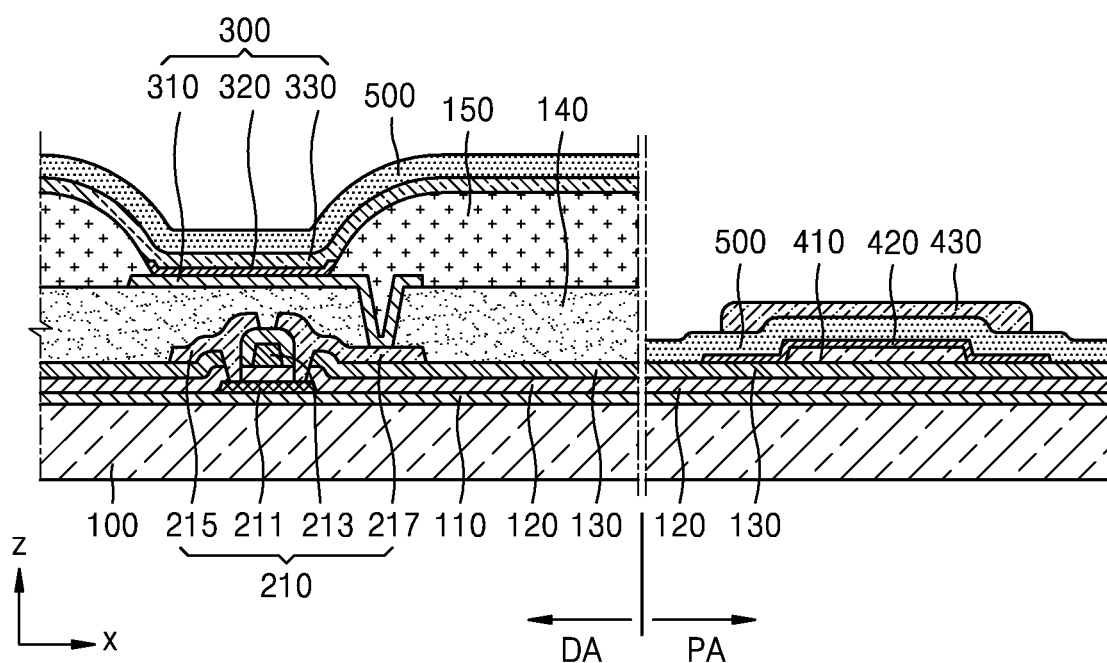
FIG. 13 is a cross-sectional view schematically illustrating a process of a method of manufacturing a display apparatus according to an embodiment.

FIG. 13 is a cross-sectional view schematically illustrating a process of a method of manufacturing a display apparatus according to an embodiment. In the method of manufacturing the display apparatus according to this embodiment, after the encapsulation layer 500 is formed, an additional organic layer 430 is formed over a portion of the encapsulation layer 500 which is disposed over the sacrificial layer 420. As illustrated and described in FIG. 5, the cracks CR are formed in the encapsulation layer 500. When at least a portion of the encapsulation layer 500 in the pad area PA is removed after the cracks CR are grown, the portion of the encapsulation layer 500 and the entire (e.g., substantially the entire) additional organic layer 430, which are in the pad area PA, may be concurrently (e.g., simultaneously) removed.

When the cracks CR formed in the encapsulation layer 500 grown, and then at least a portion of the encapsulation layer 500 is removed in the pad area PA, a portion of the encapsulation layer 500, which is to be removed, may remain in the pad area PA without being removed. In a process of forming the cracks CR in the encapsulation layer 500 and growing the formed cracks CR, the portion of the encapsulation layer 500 may remain in the pad area PA of the substrate 100 without being removed when the portion of the encapsulation layer 500 is physically separated from other portions of the encapsulation layer 500 to be removed.

However, in the method of manufacturing the display apparatus according to the present disclosure, the additional organic layer 430 may be disposed over the encapsulation layer 500 and may function as an adhesive to couple (e.g., connect) all (e.g., substantially all) of the portions of the encapsulation layer 500, which are to be removed, to each other, in the process of growing the cracks CR in the encapsulation layer 500 and separating the portion of the encapsulation layer 500 from the other portions of the encapsulation which are to be removed. Accordingly, all (e.g., substantially all) of the portions of the encapsulation layer 500, which is to be removed, may be concurrently (e.g., simultaneously) removed. In order to do this, an adhesive force between the encapsulation layer 500 and the additional organic layer 430 may be greater than an adhesive force between the encapsulation layer 500 and the sacrificial layer 420. The additional organic layer 430 may include, for example, polyacrylate, polyethylene terephthalate (PET), polyethylene naphthalate (PEN), polycarbonate, polyimide, polyethylene sulfonate, polyoxymethylene, polyarylate, and/or epoxy. The additional organic layer 430 may be formed to correspond to the sacrificial layer 420 and may be formed according to the inkjet printing method. The forming the additional organic layer 430 may be used in the method of manufacturing the display apparatus according to the present embodiment and also the method of manufacturing the display apparatus according to the previously described embodiments and modified examples.

In the above-described embodiments, a process of washing the pad area PA may be performed after a portion of the encapsulation layer 500 is removed. In this case, a $CO_2$ dry washing process may be used to wash the pad area PA.

Although a case in which the display element is the organic light-emitting element is described above, the present disclosure is not limited thereto. For example, the portion of the encapsulation layer 500 may be removed in the pad area PA according to the above-described method even when other display elements are formed in the display area DA of the substrate 100.

Figure 8:
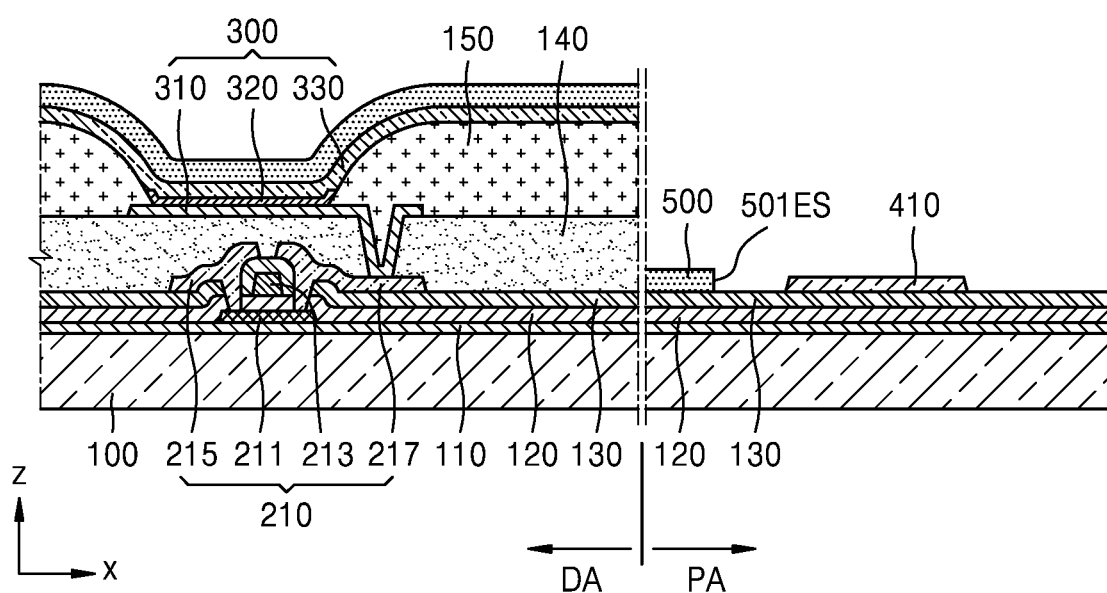
Figure 9:
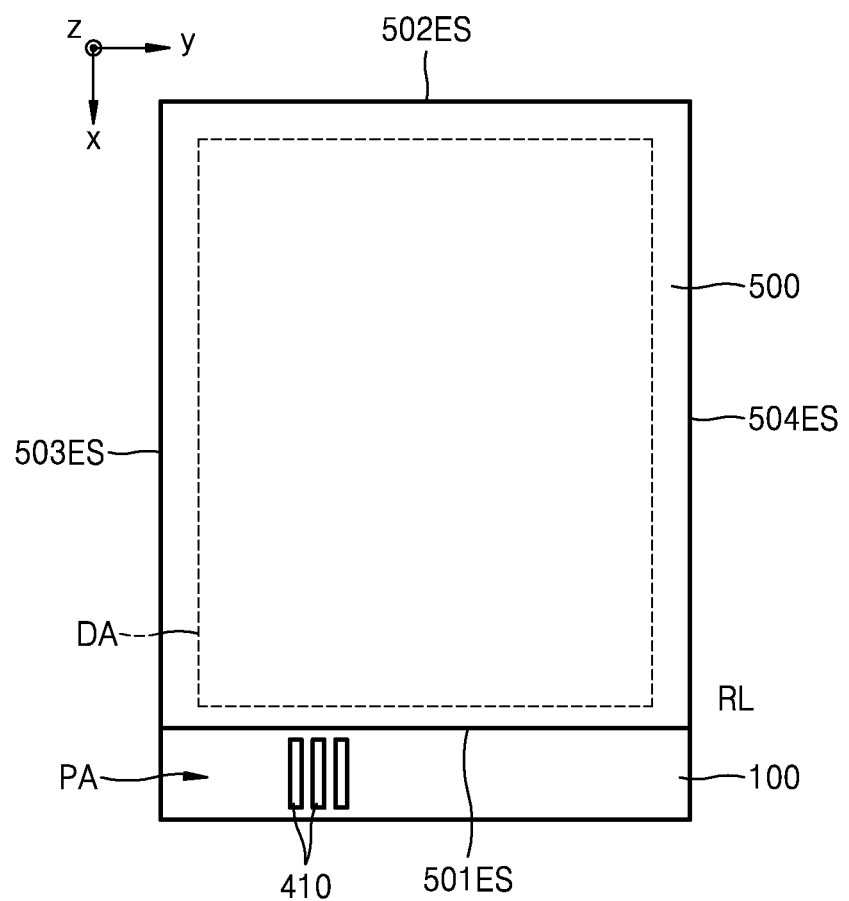

Meanwhile, the present disclosure is not limited to the method of manufacturing the display apparatus. A display apparatus manufactured according to the above-described method may be within the scope of the present disclosure. In such a display apparatus, the encapsulation layer 500 may at least partially cover (e.g., completely cover) the display area DA and thus at least partially cover (e.g., completely cover) the display elements, and in the encapsulation layer 500, a roughness of the first end surface 501ES facing the pads 410 is greater than a roughness of the second end surface 502ES facing away the pads 410 and roughnesses of the third and fourth end surfaces E503ES and 504ES, as illustrated in FIGS. 8 and 9.

In the display apparatus which is also within the scope of the present disclosure, when the encapsulation layer 500 includes the first inorganic encapsulation layer 510, the organic encapsulation layer 520, and the second inorganic encapsulation layer 530, the first end surface 501ES of the encapsulation layer 500 may include the lower end surface 501LES which is disposed closest to the substrate 100, the upper end surface 501UES which is disposed farthest from the substrate 100, and the intermediate end surface 501MES between the lower end surface 501LES and the upper end surface 501UES. The roughnesses of the lower end surface 501LES and the upper end surface 501UES may be greater than a roughness of the intermediate end surface 501MES.

It should be understood that embodiments described herein should be considered in a descriptive sense only and not for purposes of limitation. Descriptions of features or aspects within each embodiment should typically be considered as available for other similar features or aspects in other embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. For example, as described herein "a first inorganic encapsulation layer" may be "a second inorganic encapsulation layer."

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A method of manufacturing a display apparatus, the method comprising:
   preparing a substrate comprising a display area and a pad area outside of the display area;
   forming a sacrificial layer in the pad area such that the sacrificial layer does not extend into the display area;
   forming an encapsulation layer over the display area and the pad area such that the encapsulation layer covers an end surface of the sacrificial layer in a direction to the display area;
   forming cracks in at least a portion of the encapsulation layer by increasing a volume of the sacrificial layer or by gasifying or evaporating at least a portion of the sacrificial layer; and
   removing at least a portion of the encapsulation layer in the pad area.

2. The method of claim 1, wherein the forming of the sacrificial layer comprises concurrently forming an organic layer in the display area and the sacrificial layer, such that the sacrificial layer is spaced apart from the organic layer.

3. The method of claim 1, wherein the forming of the sacrificial layer comprises concurrently forming an intermediate layer interposed between a pixel electrode and an opposite electrode in the display area, and the sacrificial layer, such that the sacrificial layer is spaced apart from the intermediate layer.

4. The method of claim 1, further comprising: forming a display element in the display area,
   wherein the forming of the sacrificial layer comprises concurrently forming a capping layer comprising an organic compound and at least partially covering the display element in the display area, and the sacrificial layer, such that the sacrificial layer is spaced apart from the capping layer.

5. The method of claim 1, wherein the forming of the cracks comprises irradiating a laser beam to the portion of the encapsulation layer that is above the sacrificial layer.

6. The method of claim 5, wherein the forming of the cracks comprises using the laser beam having an absorbance in an organic compound greater than an inorganic compound.

7. The method of claim 1, wherein the forming of the encapsulation layer comprises forming an inorganic layer.

8. The method of claim 1, further comprising:
   increasing an area of a part of the encapsulation layer, the part in which the cracks are formed, by applying a force to the encapsulation layer that is above the sacrificial layer.

9. The method of claim 8, wherein the increasing of the area comprises using a roller.

10. The method of claim 1, wherein the forming of the encapsulation layer comprises:
    forming a first inorganic encapsulation layer over the display area and the pad area;
    forming an organic encapsulation layer over the first inorganic encapsulation layer, the organic encapsulation layer comprising a first portion corresponding to the display area and a second portion separate from the first portion and corresponding to the pad area; and
    forming a second inorganic encapsulation layer in the display area and the pad area to at least partially cover the first portion and the second portion of the organic encapsulation layer.

11. The method of claim 10, wherein an adhesive force between the first inorganic encapsulation layer and the organic encapsulation layer is greater than an adhesive force between the first inorganic encapsulation layer and the sacrificial layer.

12. The method of claim 10, wherein the removing of the portion of the encapsulation layer comprises removing at least a portion of the first inorganic encapsulation layer in the pad area, the entire second portion of the organic encapsulation layer, and at least a portion of the second inorganic encapsulation layer in the pad area.

13. The method of claim 1, further comprising:
    forming an additional organic layer over the portion of the encapsulation layer that is over the sacrificial layer,
    wherein the removing of the portion of the encapsulation layer comprises removing the portion of the encapsulation layer that is over the sacrificial layer, and the entire additional organic layer.

14. The method of claim 13, wherein an adhesive force between the encapsulation layer and the additional organic layer is greater than an adhesive force between the encapsulation layer and the sacrificial layer.

* * * * *